United States Patent
Hsu et al.

(10) Patent No.: US 10,678,312 B2
(45) Date of Patent: Jun. 9, 2020

(54) PORTABLE ELECTRONIC DEVICE

(71) Applicant: Quanta Computer Inc., Taoyuan (TW)

(72) Inventors: Shu-Cheng Hsu, Taoyuan (TW); Ku-Wu Lai, Taoyuan (TW); Hsin-I Wu, Taoyuan (TW); Chien-Yu Shih, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/388,284

(22) Filed: Apr. 18, 2019

(65) Prior Publication Data

US 2020/0142456 A1 May 7, 2020

(30) Foreign Application Priority Data

Nov. 7, 2018 (TW) .............................. 107139549 A

(51) Int. Cl.
| | | |
|---|---|---|
| *G06F 1/20* | (2006.01) | |
| *G06F 1/16* | (2006.01) | |
| *H05K 5/02* | (2006.01) | |
| *H05K 7/20* | (2006.01) | |

(52) U.S. Cl.
CPC ............ *G06F 1/203* (2013.01); *G06F 1/1616* (2013.01); *G06F 1/1681* (2013.01); *H05K 5/0213* (2013.01); *H05K 7/20136* (2013.01)

(58) Field of Classification Search
CPC .......... G06F 1/20; G06F 1/203; G06F 1/1681; G06F 1/1616; H05K 5/0213; H05K 7/20136
USPC ........................... 361/679.27, 679.46, 679.48
See application file for complete search history.

(56) References Cited

U.S. PATENT DOCUMENTS

| | | | | |
|---|---|---|---|---|
| 5,534,891 A | * | 7/1996 | Takano | G06F 1/1616 345/169 |
| 5,552,960 A | * | 9/1996 | Nelson | G06F 1/203 165/104.33 |
| 6,008,986 A | * | 12/1999 | Mok | G06F 1/1616 361/679.12 |
| 6,028,768 A | * | 2/2000 | Cipolla | G06F 1/1616 361/679.12 |
| 6,175,492 B1 | * | 1/2001 | Nobuchi | G06F 1/1616 361/679.08 |
| 6,437,978 B1 | * | 8/2002 | Ozaki | G06F 1/203 165/104.33 |

(Continued)

FOREIGN PATENT DOCUMENTS

| | | |
|---|---|---|
| TW | 201419993 A | 5/2014 |
| TW | 201528918 A | 7/2015 |

(Continued)

*Primary Examiner* — Jayprakash N Gandhi
*Assistant Examiner* — Stephen S Sul
(74) *Attorney, Agent, or Firm* — Rabin & Berdo, P.C.

(57) ABSTRACT

A portable electronic device includes a first component, a second component, a pivoting device, a cover member and a linkage module. The second component is pivotally coupled to the first component through a pivoting device. The second component has an internal space and a sunken portion. The sunken portion is in communication with the internal space. The cover member is movably embedded in the sunken portion. The linkage module is coupled to the pivoting device and the cover member for selectively pushing the cover member out of the sunken portion with the movement of the pivoting device.

8 Claims, 9 Drawing Sheets

(56) References Cited

U.S. PATENT DOCUMENTS

| | | | | |
|---|---|---|---|---|
| 6,459,573 | B1* | 10/2002 | DiStefano | G06F 1/203 |
| | | | | 361/679.46 |
| 6,853,543 | B1* | 2/2005 | Moore | G06F 1/1667 |
| | | | | 361/679.12 |
| 7,187,537 | B2* | 3/2007 | Liao | G06F 1/1616 |
| | | | | 361/679.09 |
| 7,894,184 | B2* | 2/2011 | Huang | G06F 1/1616 |
| | | | | 361/679.11 |
| 8,014,147 | B2* | 9/2011 | Chen | G06F 1/1616 |
| | | | | 200/61.62 |
| 8,520,382 | B2* | 8/2013 | Tye | G06F 1/203 |
| | | | | 248/685 |
| 9,104,374 | B2* | 8/2015 | Tsai | G06F 1/1616 |
| 9,189,032 | B2* | 11/2015 | Jheng | G06F 1/1681 |
| 9,213,371 | B2* | 12/2015 | Liu | G06F 1/1664 |
| 2008/0101003 | A1* | 5/2008 | Lin | G06F 1/203 |
| | | | | 361/679.27 |
| 2010/0165567 | A1* | 7/2010 | Shih | G06F 1/1616 |
| | | | | 361/679.48 |
| 2010/0269298 | A1* | 10/2010 | Chiang | G06F 1/1616 |
| | | | | 16/361 |
| 2012/0127652 | A1* | 5/2012 | Lin | G06F 1/203 |
| | | | | 361/679.46 |
| 2017/0235337 | A1* | 8/2017 | Vic | E05D 3/12 |
| | | | | 361/679.55 |

FOREIGN PATENT DOCUMENTS

| | | |
|---|---|---|
| TW | M539210 U | 4/2017 |
| TW | M547233 U | 8/2017 |

\* cited by examiner

US 10,678,312 B2

PORTABLE ELECTRONIC DEVICE

RELATED APPLICATIONS

This application claims priority to Taiwan Application Serial Number 107139549, filed Nov. 7, 2018, which is herein incorporated by reference.

BACKGROUND

Field of Disclosure

The disclosure relates to a portable electronic device. More particularly, the disclosure relates to a portable electronic device having hidden ventilation openings.

Description of Related Art

With the improvement of technology, a portable electronic device (e.g., notebook computer) is developed in a trend of lightweight, small size and higher computing speed. However, when the portable electronic device is in the configuration with a reduced overall structure, the heat dissipation efficiency of the portable electronic device might be reduced, so that the portable electronic device requires auxiliary fans for actively removing the thermal energy in the portable electronic device.

Although the auxiliary fans are installed in the portable electronic device, however, if the heat dissipation efficiency of the portable electronic device cannot be effectively improved, the portable electronic device in a high temperature environment in a long-term not only can cause crash easily, but also shorten the working life of each component of the portable electronic device.

SUMMARY

In one embodiment of the disclosure, a portable electronic device is provided, and includes a first component, a second component, a pivoting device, at least one cover member and a linkage module. The second component is pivotally coupled to the first component through the pivoting device, and formed with an internal space and a sunken portion in communication with the internal space. The cover member is movably disposed in the sunken portion. The linkage module is coupled to the pivoting device and the cover member for selectively pushing the cover member out of the sunken portion with the movement of the pivoting device.

In another embodiment of the disclosure, a portable electronic device is provided, and includes a first component, a second component, a pivoting device, a plurality of cover members and a linkage module. The second component is pivotally coupled to the first component through the pivoting device, and formed with an internal space. The cover members are rotatably connected to the second component respectively, and embedded in two opposite surfaces of the second component respectively. The linkage module is coupled to the pivoting device and the cover members. Thus, when the first component rotates relative to the second component, the linkage module respectively rotates the cover members out of the two opposite surfaces of the second component with the movement of the pivoting device such that a ventilation opening in communication with the internal space is formed between the second component and each of the cover members.

With the structure described in the above embodiments, the portable electronic device can be switched to provide more ventilation openings, thereby improving the heat dissipation efficiency of the portable electronic device, reducing the possibility of causing crash and shortening the working life of each component of the portable electronic device. In addition, since the portable electronic device is already formed with at least one ventilation opening, the portable electronic device can choose to omit a fixing opening thereon, so that the overall thickness of the portable electronic device can be improved.

The above description is merely used for illustrating the problems to be resolved, the technical methods for resolving the problems and their efficacies, etc. The specific details of the disclosure will be explained in the embodiments below and related drawings.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

DESCRIPTION OF THE EMBODIMENTS

Figure 1:
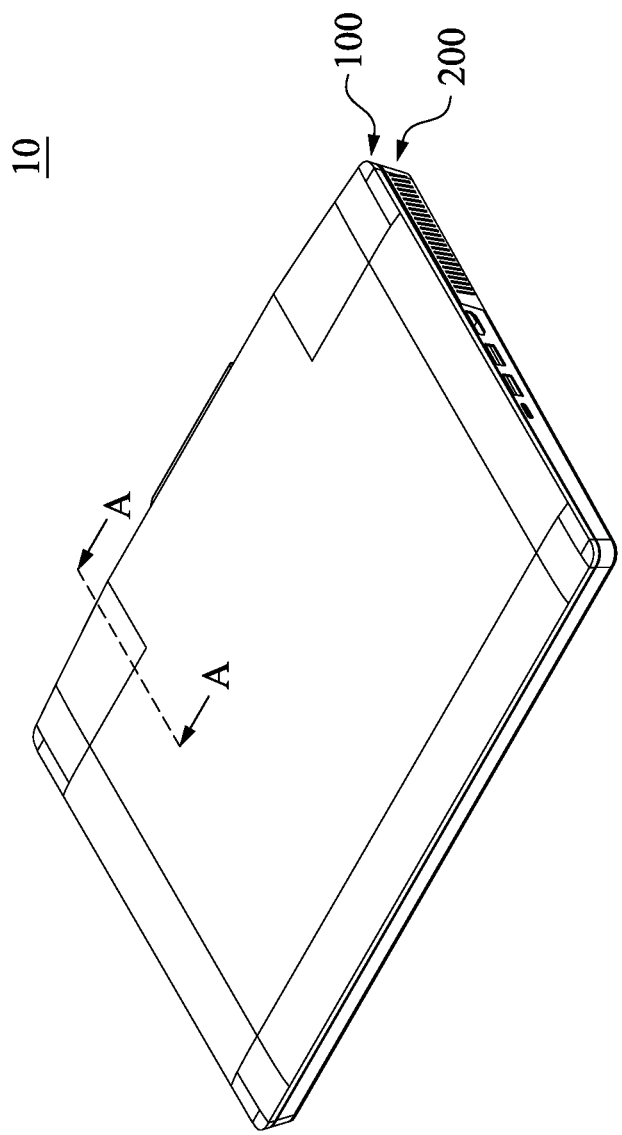
FIG. 1 is a perspective view showing a portable electronic device in a closed state according to one embodiment of the disclosure.

Reference will now be made in detail to the present embodiments of the disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the disclosure without departing from the scope or spirit of the disclosure.

Figure 2:
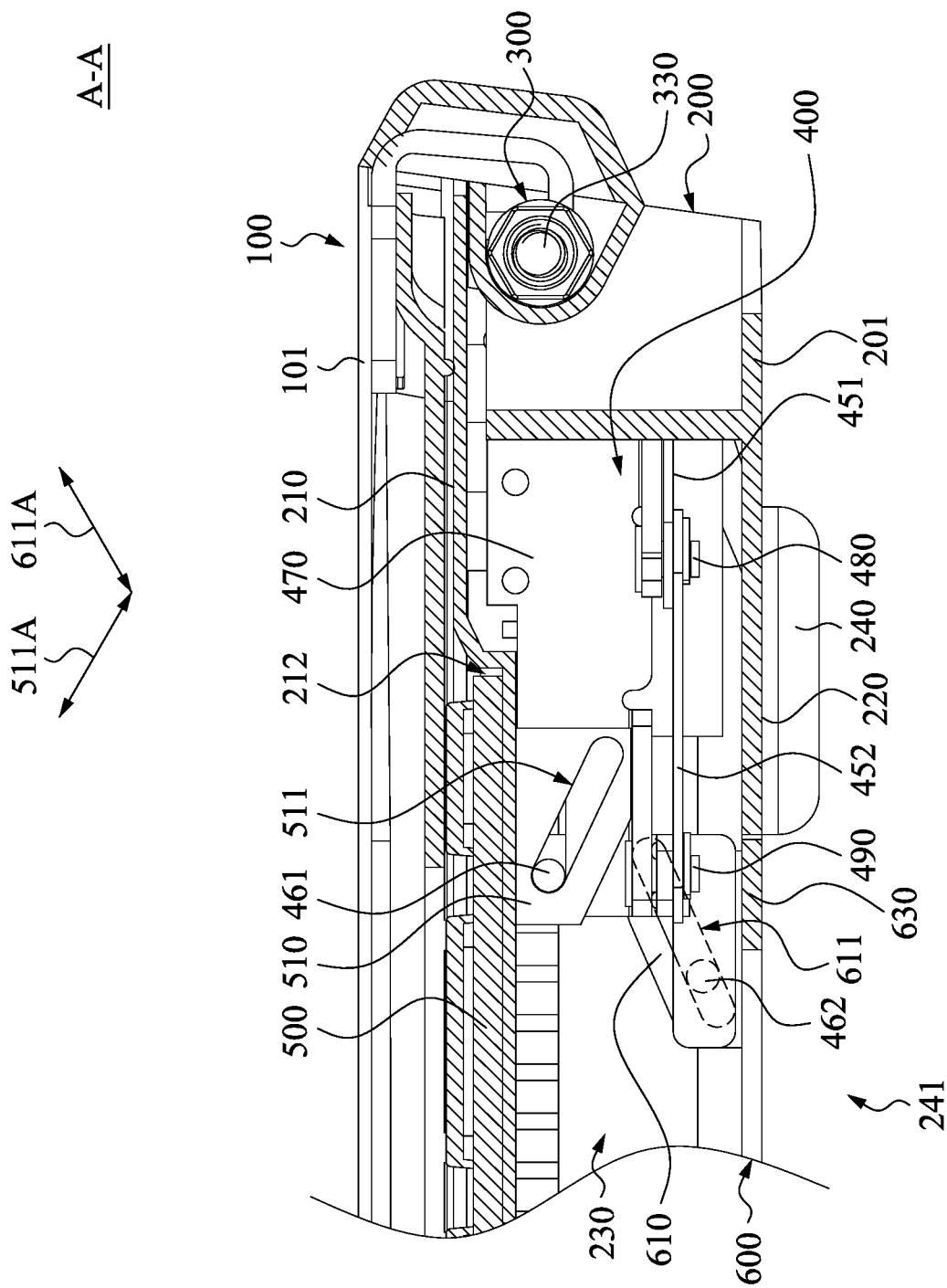
FIG. 2 is a partial cross-sectional view of the portable electronic device along a line A-A of FIG. 1.
Figure 3:
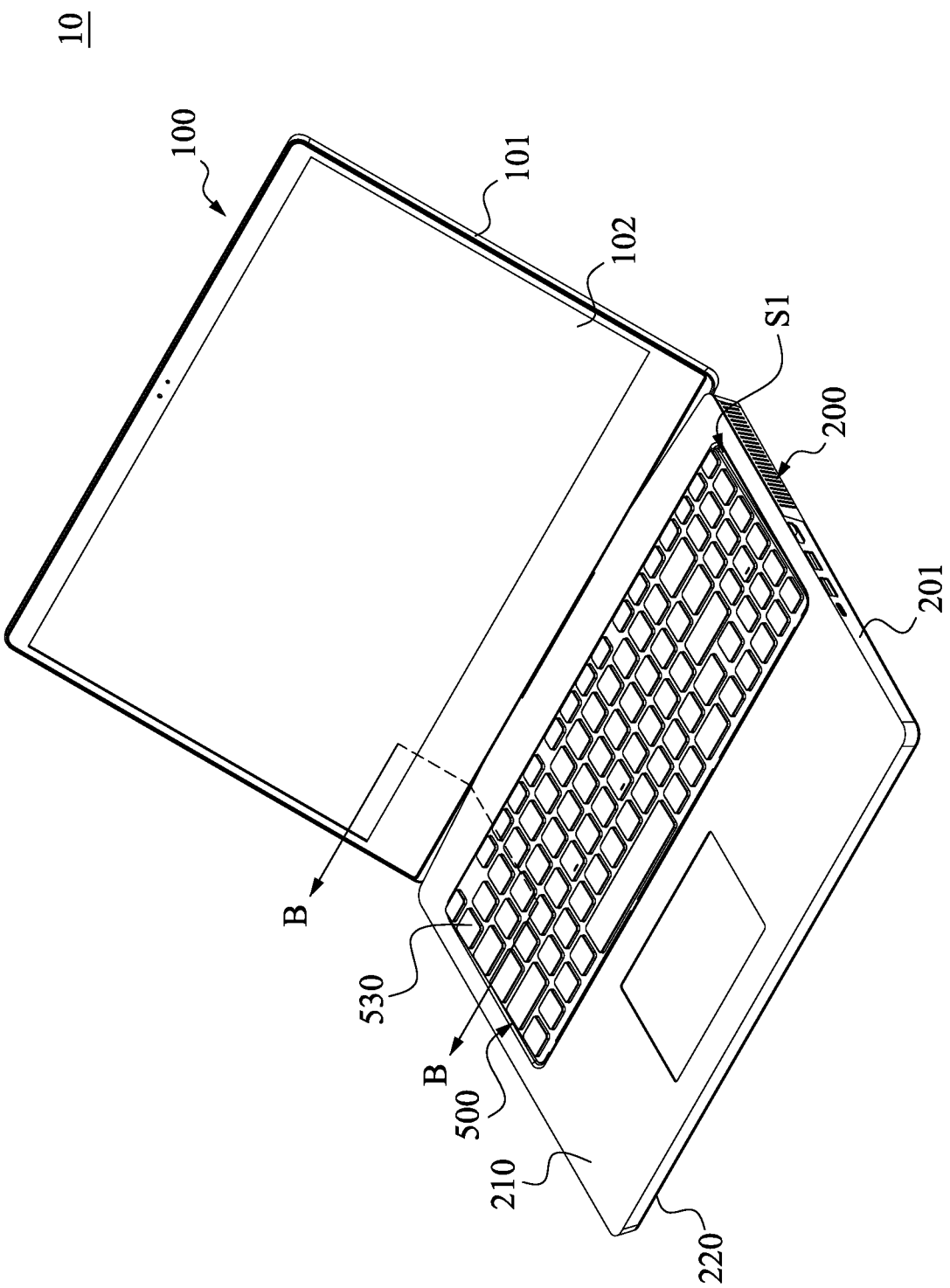
FIG. 3 is a perspective view showing the portable electronic device of FIG. 1 in an unfolded state.
Figure 4:
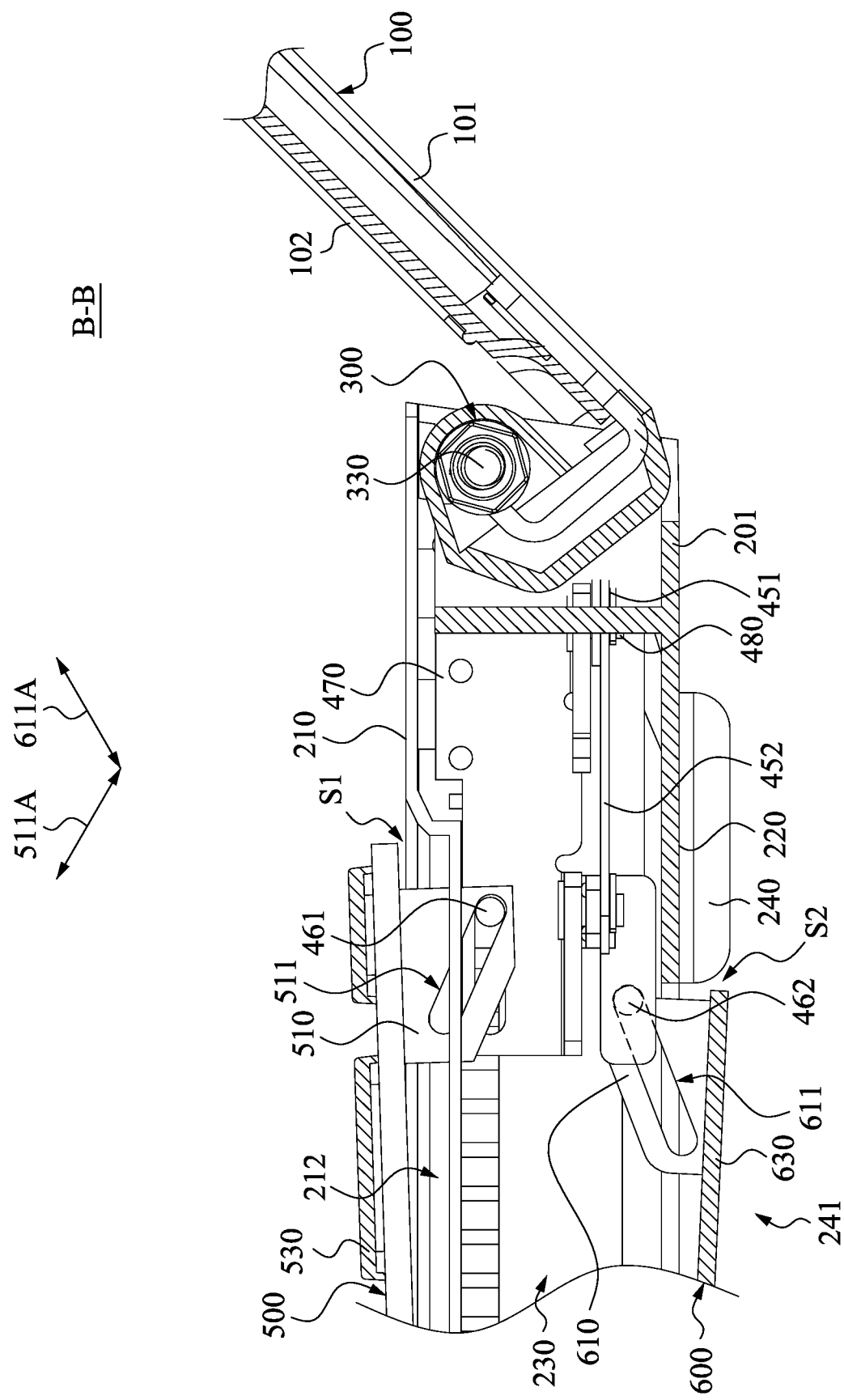
FIG. 4 is a partial cross-sectional view of the portable electronic device along a line B-B of FIG. 3.

Reference is now made to FIG. 1 to FIG. 4, in which FIG. 1 is a perspective view showing a portable electronic device 10 in a closed state according to one embodiment of the disclosure, FIG. 2 is a partial cross-sectional view of the portable electronic device 10 along a line A-A of FIG. 1, FIG. 3 is a perspective view showing the portable electronic device 10 of FIG. 1 in an unfolded state, and FIG. 4 is a partial cross-sectional view of the portable electronic device 10 along a line B-B of FIG. 3. As shown in FIG. 1 to FIG. 4, a portable electronic device 10 includes a first component 100, a second component 200, at least one pivoting device 300, a linkage module 400, a first cover member 500 and a second cover member 600. The second component 200 is provided with a top surface 210 and a bottom surface 220 which are opposite to each other. The first component 100 is pivotally coupled to the second component 200 through the pivoting device 300 so that the first component 100 is rotatable about the pivoting device 300 relative to the second component 200. When the first component 100 is rotated to be superposed on the top surface 210 of the second component 200, the portable electronic device 10 is in a closed state, as shown in FIG. 1; on the contrary, when the first component 100 is unfolded and rotated away from the top surface 210 of the second component 200, the portable electronic device 10 is in an unfolded state, as shown in FIG. 3. The first cover member 500 and the second cover member 600 are respectively rotatably connected to the second component 200. The first cover member 500 is disposed in the top surface 210 of the second component 200, and the second cover member 600 is disposed in the bottom surface 220. The linkage module 400 is coupled to the pivoting device 300, the first cover member 500 and the second cover member 600.

When the first component 100 is rotated relative to the second component 200 so as to be in the unfolded state, with the movement of the pivoting device 300, the linkage module 400 pushes the first cover member 500 and the second cover member 600 out of two opposite sides of the second component 200, respectively. That is, the linkage module 400 respectively pushes the first cover member 500 away from the top surface 210 of the second component 200, and pushes the second cover member 600 away from the bottom surface 220 of the second component 200 so that a first ventilation opening S1 (refer to FIG. 4) is unveiled between the first cover member 500 and the top surface 210 of the second component 200, and a second ventilation opening S2 (refer to FIG. 4) is unveiled between the second cover member 600 and the bottom surface 220 of the second component 200, and both of the first ventilation opening S1 and the second ventilation opening S2 are in communication with an internal space 230 of the second component 200. On the contrary, when the first component 100 is rotated relative to the second component 200 so as to be in the closed state, with the movement of the pivoting device 300, the linkage module 400 respectively pulls the first cover member 500 and the second cover member 600 back in the top surface 210 and the bottom surface 220 of the second component 200 so as to hide the first ventilation opening S1 and the second ventilation opening S2.

Specifically, the second component 200 further includes a plurality of foot cushions 240. The foot cushions 240 are separately disposed on the bottom surface 220 of the second component 200 so that the portable electronic device 10 can be stably placed on a plane (not shown). The foot cushions 240 and the bottom surface 220 of the second component 200 collectively define a partition space 241, that is, the partition space 241 is located between the foot cushions 240, the bottom surface 220 of the second component 200 and the plane described above. When the second cover member 600 is pushed away from the bottom surface 220 of the second component 200, the second cover member 600 is located within the partition space 241, namely, when the portable electronic device 10 is placed on the plane, the second cover member 600 pushed away from the bottom surface 220 is located in a space defined between the bottom surface 220 and the plane described above.

Figure 5:
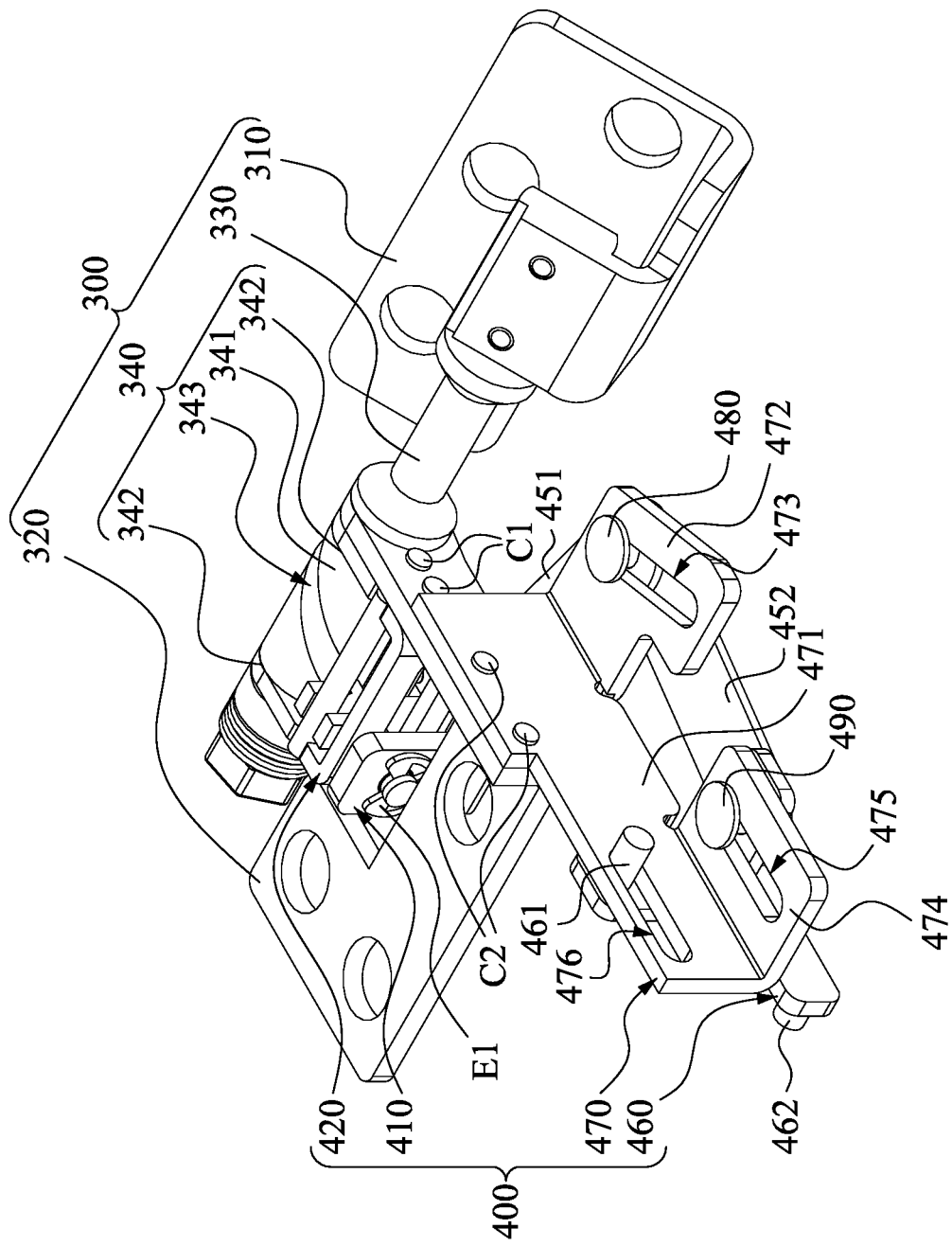
FIG. 5 is an assembly view of the pivoting device and the linkage module of FIG. 1.
Figure 6:
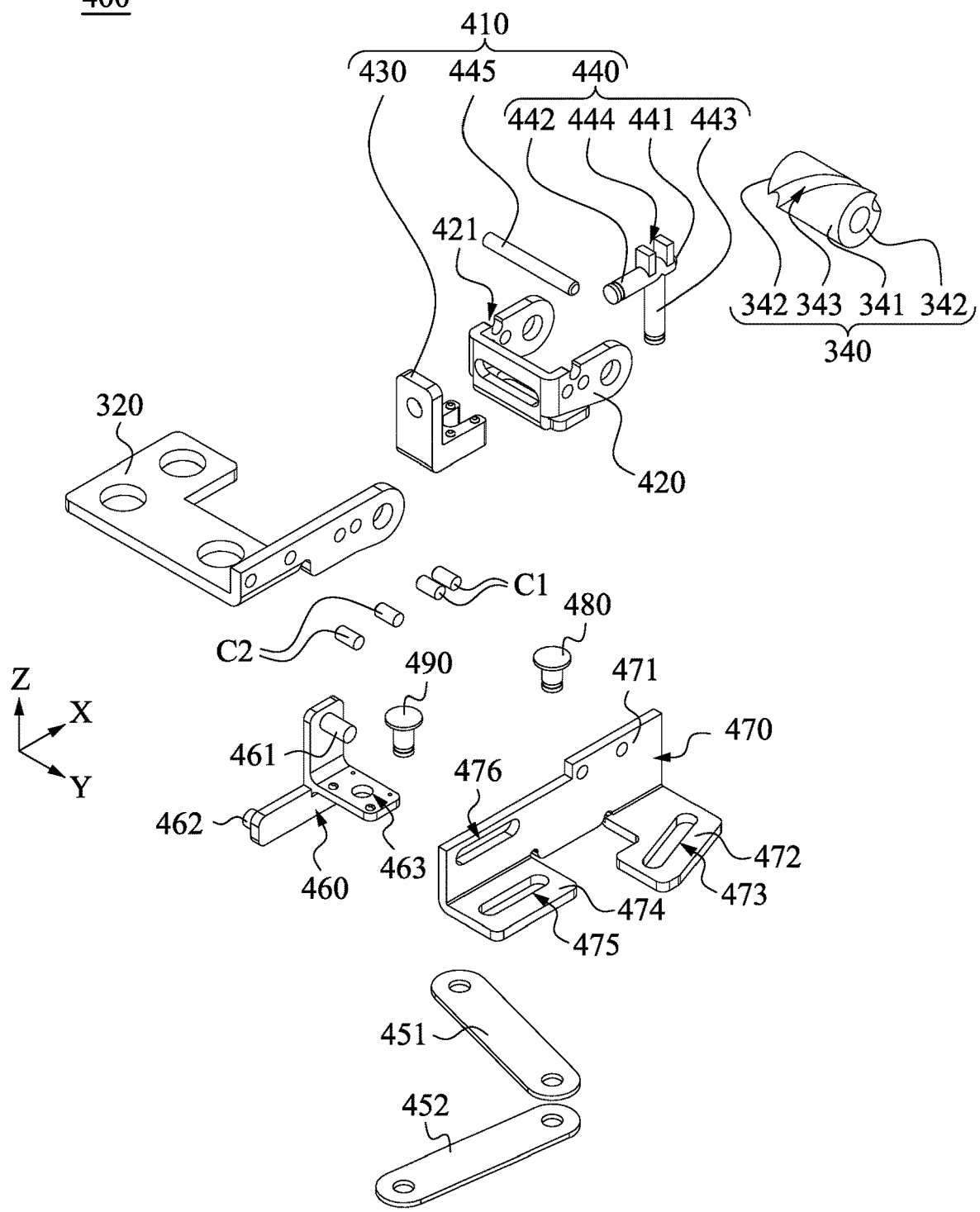
FIG. 6 is an exploded view of the linkage module and a part of the pivoting device of FIG. 5.
Figure 7:
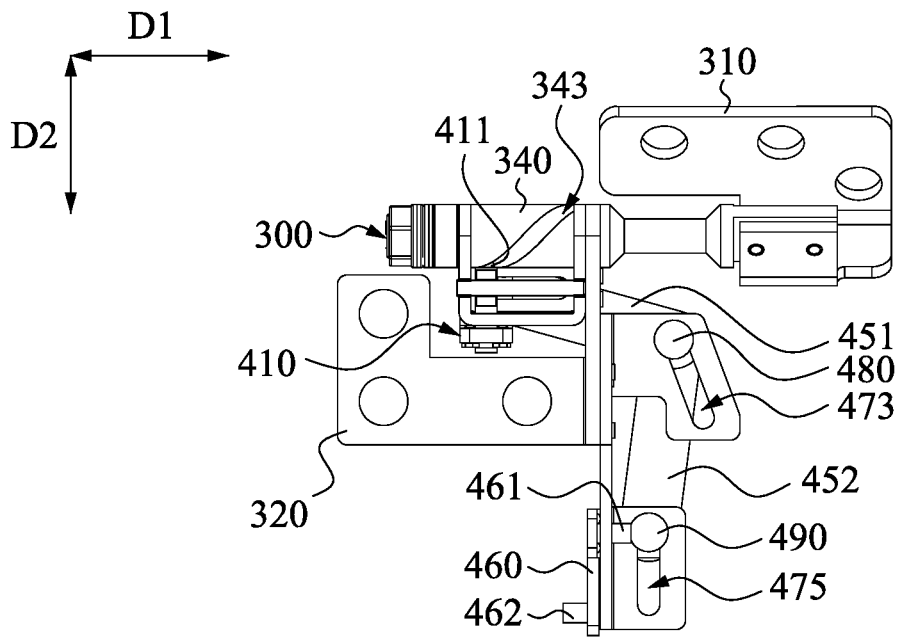
FIG. 7 is a top view of the pivoting device and the linkage module of FIG. 5 in the closed state.
Figure 8:
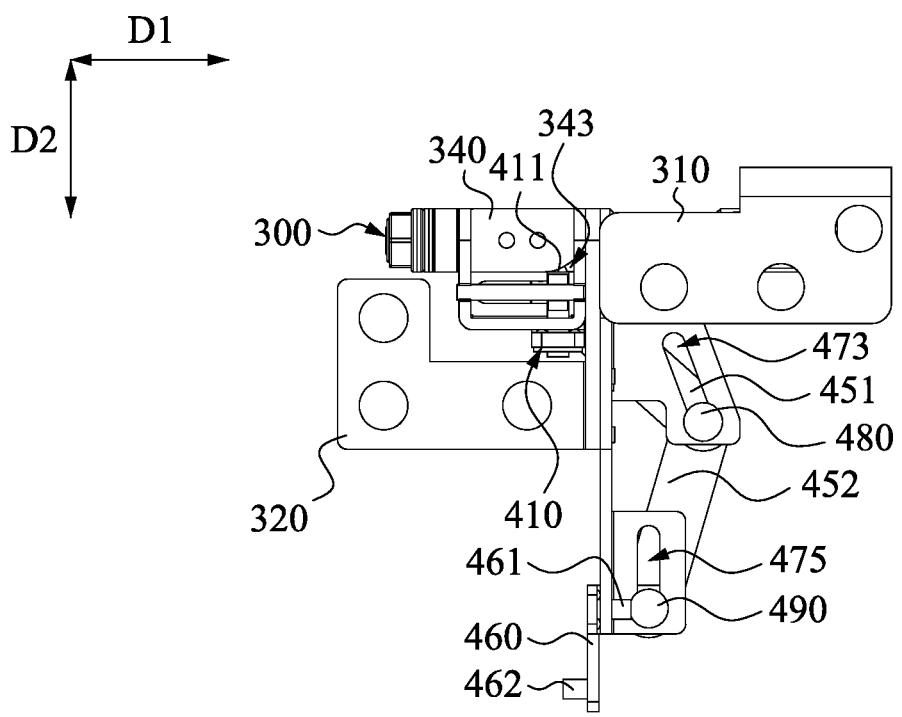
FIG. 8 is a top view of the pivoting device and the linkage module of FIG. 5 in the unfolded state.

Reference is now made to FIG. 5 to FIG. 8, in which FIG. 5 is an assembly view of the pivoting device 300 and the linkage module 400 of FIG. 1, FIG. 6 is an exploded view of the linkage module 400 and a part of the pivoting device 300 of FIG. 5, FIG. 7 is a top view of the pivoting device 300 and the linkage module 400 of FIG. 5 in the closed state, and FIG. 8 is a top view of the pivoting device 300 and the linkage module 400 of FIG. 5 in the unfolded state. Specifically, as shown in FIG. 5 to FIG. 6, the pivoting device 300 includes a first connecting frame 310, a second connecting frame 320, a shaft set 330, a linkage guiding post 340 and a spiral guiding groove 343. The first connecting frame 310 is connected one end of the shaft set 330 and is fixedly connected to the first component 100. The second connecting frame 320 is connected to the other end of the shaft set 330, fixedly coupled to the second component 200, and the shaft set 330 can be pivoted relative to the second connecting frame 320 (i.e., the second component 200). The linkage guiding post 340 is fixedly sleeved on the shaft set 330, and is synchronously moved with the first component 100. The linkage guiding post 340 includes a circumferential surface 341 and two opposite end surfaces 342. The circumferential surface 341 is located between the end surfaces 342 to surround the end surfaces 342, respectively. The spiral guide groove 343 is formed on the circumferential surface 341 of the linkage guiding post 340, and extends from one end surface 342 of the linkage guiding post 340 to the other end surface 342 of the linkage guiding post 340 according to a spiral extension fashion.

In addition, the linkage module 400 includes a sliding component 410, a first connecting lever 451, a second connecting lever 452, a leading frame 460, a fixing frame 470, a first shaft body 480 and a second shaft body 490. The sliding component 410 is slidably disposed within the spiral guide groove 343. The first connecting lever 451 is rotatably connected to the sliding component 410. The leading frame 460 is slidably connected to the first cover member 500 and the second cover member 600. The second connecting lever 452 is pivotally connected to the first connecting lever 451 and the leading frame 460.

More specifically, the sliding component 410 includes an outer frame 420, an L-shaped reinforcing member 430, a linking rod 440 and a guide rod 445. The outer frame 420 is fixedly connected to the other end of the shaft set 330, and is fixedly connected to the second component 200. For example, the outer frame 420 is fixedly connected to the second connecting frame 320 through a fixing pin C1 (FIG. 5). Therefore, the sliding component 410 is synchronously moved with the second connecting frame 320 (i.e., the second component 200). The guide rod 445 is fixedly connected on the outer frame 420 in which the guide rod 445 is horizontally placed within two placement grooves 421 of the outer frame 420, and extends in a first linear direction D1.

The linking rod 440 includes a bump 441, a first linear rod 442, a second linear rod 443 and a guiding fork 444. The second linear rod 443 extends outwards from one of the longer sides of the first linear rod 442 along the Z axis (FIG. 6), and a major axis direction of the first linear rod 442 (such as X axis, FIG. 6) is perpendicular to a major axis direction of the second linear rod 443 (such as Z axis, FIG. 6). The guiding fork 444 extends outwards from the other of the longer sides of the first linear rod 442 along the Z axis (FIG. 6). The bump 441 is located at one end of the first linear rod 442, and the bump 441 is slidably located within the spiral guiding groove 343. The other end of the first linear rod 442 facing away from the bump 441 is fixed on one end of the L-shaped reinforcing member 430. One end of the second linear rod 443 facing away from the first linear rod 442 is fixed to the other end of the L-shaped reinforcing member 430 by a fastener E1 (such as an E-ring), and the end of the second linear rod 443 is pivotally connected to one end of the first connecting lever 451. Therefore, the L-shaped reinforcing member 430 and the linking rod 440 are synchronously moved together. Moreover, the guide rod 445 is located within a fork groove of the guiding fork 444 to restrict that the L-shaped reinforcing member 430 and the linking rod 440 are allowed to linearly move in the first linear direction D1 only.

The fixing frame 470 is disposed in the second component 200 and is fixedly connected to the second component 200. For example, the fixing frame 470 is fixedly connected to the second connecting frame 320 through a fixing pin C2 (FIG. 5). The fixing frame 470 includes a frame body 471 having a first flange 472 and a second flange 474 at the same side of the frame body 471. The first flange 472 is formed with a first elongated slot 473. The second flange 474 is formed with a second elongated slot 475 which extends in a second linear direction D2 (FIG. 7). The first elongated slot 473 and the second elongated slot 475 are oppositely arranged on the fixing frame 470. The first shaft body 480 is pivotally connected to the other end of the first connecting lever 451 and one end of the second connecting lever 452, and is slidably received within the first elongated slot 473 so as to limit the first connecting lever 451 and the second connecting lever 452 to be moved by the first shaft body 480 travelled along a major axis direction of the first elongated slot 473 only as the first connecting lever 451 and the second connecting lever 452 is pivotally connected to each other. The second shaft body 490 is pivotally connected to the other end of the second connecting lever 452 and the leading frame 460, and is slidably received within the second elongated slot 475 so as to limit the leading frame 460 and the second connecting lever 452 to be moved by second shaft body 490 travelled along the a major axis direction (i.e., D2) of the second elongated slot 475 only as the leading frame 460 and the second connecting lever 452 are pivotally connected to each other.

The leading frame 460 is formed with a first protruding shaft 461, a second protruding shaft 462 and a shaft hole 463. The second shaft body 490 is located within the shaft hole 463. The first protruding shaft 461 and the second protruding shaft 462 are arranged oppositely on an upper side and a lower side of the leading frame 460, respectively. The first cover member 500 is formed with two first lugs 510 (FIG. 4). Each of the first lugs 510 is formed with a first sliding slot 511. A major axis direction 511A of the first sliding slot 511 obliquely intersects the second linear direction D2. In two opposite ends of the first sliding slot 511, one of the two opposite ends of the first sliding slot 511 closer to the pivoting device 300 is closer to the second cover member 600. The first protruding shaft 461 passes through a third slot 476 of the frame body 471, and is slidably located in the first sliding slot 511. The second cover member 600 is provided with two second lugs 610 (FIG. 4). Each of the second lugs 610 is formed with a second sliding slot 611. The major axis direction 611A of the second sliding slot 611 obliquely intersects the second linear direction D2, and the opposite ends of the second sliding slot are closer to the first cover member 500 than the one end of the pivoting device 300. In two opposite ends of the second sliding slot 611, one of the two opposite ends of the second sliding slot 611 closer to the pivoting device 300 is closer to the first cover member 500. The second protruding shaft 462 is slidably located in the second sliding slot 611.

As shown in FIG. 7 and FIG. 8, when the portable electronic device is operated to be changed from the closed state to the unfolded state, the linkage guiding post 340 will rotate synchronously with the first component (refer to the first connecting frame 310), thereby allowing the spiral guiding groove 343 to push the bump 441 of the sliding component 410. Therefore, by the guiding of the spiral guiding groove 343, the sliding component 410 is linearly movable relative to the linkage guiding post 340 in the first linear direction D1, that is, the rotational motion of the linkage guiding post 340 is converted into the linear movement of the sliding component 410 along the first linear direction D1; next, by the guiding of the first elongated slot 473 and the second elongated slot 475, the first connecting lever 451 and the second connecting lever 452 are synchronously moved by the sliding component 410 so as to linearly move the leading frame 460 in the second linear direction D2, that is, the linear movement of the sliding component 410 along the first linear direction D1 is converted into the linear movement of the leading frame 460 along the second linear direction D2.

Next, as shown in FIG. 4 and FIG. 8, since the leading frame 460 moves linearly toward the pivoting device 300 in the second linear direction D2, that is, the first protruding shaft 461 linearly pushes the first sliding slot 511, and the second protruding shaft 462 linearly pushes the second sliding slot 611. Thus, by the guiding of the first sliding slot 511 and the second sliding slot 611, the first cover member 500 and the second cover member 600 can be synchronously pushed out of the top surface 210 and the bottom surface 220 of the second component 200 so to respectively unveil the aforementioned first ventilation opening S1 and the aforementioned second ventilation opening S2.

Figure 9A:
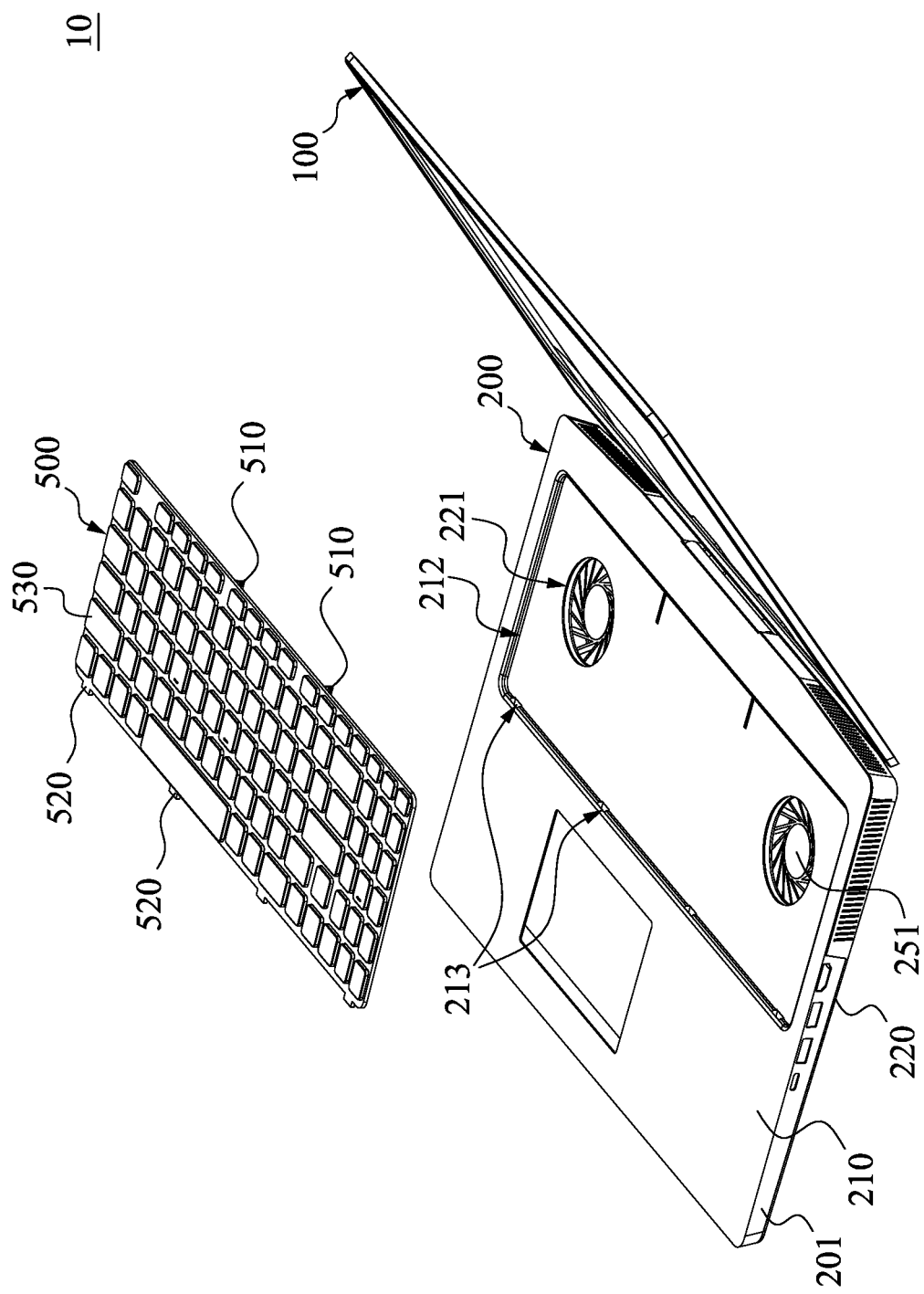
FIG. 9A is an exploded view of the first cover member and the second component of FIG. 3.
Figure 9B:
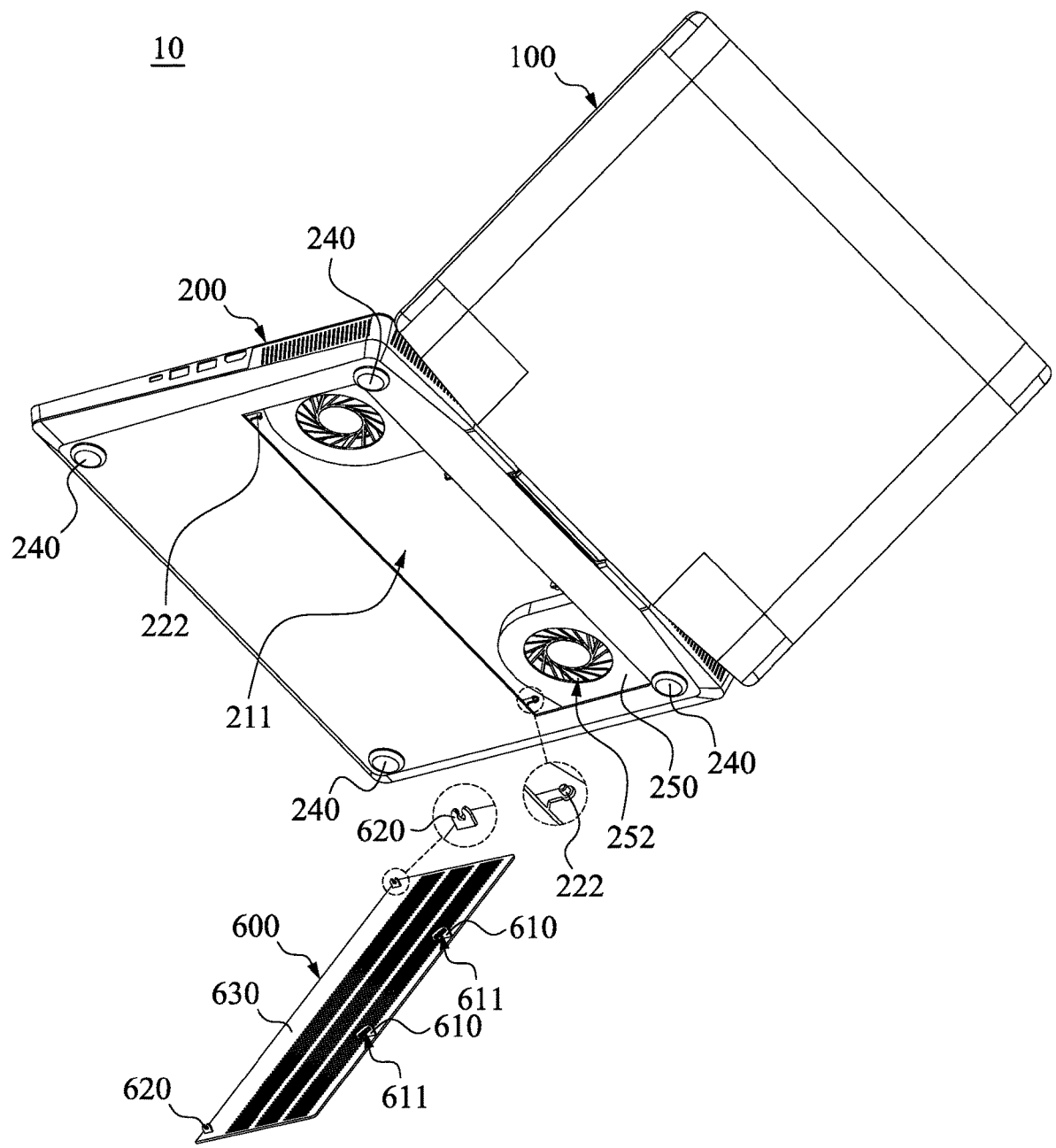
FIG. 9B is an exploded view of the second cover member and the second component of FIG. 3.

FIG. 9A is an exploded view of the first cover member 500 and the second component 200 of FIG. 3, and FIG. 9B is an exploded view of the second cover member 600 and the second component 200 of FIG. 3. As shown in FIG. 9A and FIG. 9B, the second component 200 is formed with a breach 211, a sunken portion 212 and one or more (e.g., two) through holes 221. The sunken portion 212 is concavely formed on the top surface 210 of the second component 200. The through holes 221 are respectively formed on the bottom of the sunken portion 212, and are in communication with the sunken portion 212 and the internal space 230 of the second component 200. The first cover member 500 is removably embedded in the sunken portion 212, and the first cover member 500 is approximately the same as the sunken portion 212 in size. The breach 211 is formed on the bottom surface 220 of the second component 200, and is in communication with the internal space 230 of the second component 200. The second cover member 600 is removably embedded in the breach 211, and the breach 211 is approximately the same as the second cover member 600 in size.

The linkage module 400 can be linked with the movement of the pivoting device 300 to selectively push the first cover member 500 out of the sunken portion 212, and the second cover member 600 out of the breach 211. When the first cover member 500 has not been pushed out, the first cover member 500 is matched to inlay into the sunken portion 212 such that one surface of the first cover member 500 is flush with the top surface 210 of the second component 200. When the second cover member 600 has not been pushed out, the second cover member 600 is matched to inlay into the breach 211 such that one surface of the second cover member 600 is flush with the bottom surface 220 of the second component 200.

When the first cover member 500 is pushed out to unveil the first ventilation opening S1, and the second cover member 600 is pushed out to unveil the second ventilation opening S2 (FIG. 4), the atmosphere airflows can be introduced into the internal space 230 of the second component 200 through the first ventilation opening S1 and the through holes 221 (FIG. 9A), and through the second ventilation opening S2 and the breach 211 (FIG. 9B), respectively. Thereby providing more heat-dissipation paths and improving heat dissipation efficiency.

In this embodiment, for example, the portable electronic device 10 is a notebook computer. The first component 100 includes an upper housing 101 having a display screen 102 thereon, and the second component 200 includes a lower housing 201 having a host computer mainframe therein. However, the disclosure is not limited to types of the portable electronic device. In addition, in the embodiment, the first cover member 500 mentioned above is a keyboard set 530 embedded in the top surface 210 thereof, and the second cover member 600 is an outer finishing panel 630 embedded in the bottom surface 220 thereof. However, the disclosure is not limited to types and quantity of the above-mentioned cover members. Exemplarily, each of the first cover member and the second cover member is an outer finishing panel, respectively.

Also, the portable electronic device 10 further includes one or more (e.g., two) fan units 250 and a heat source (not shown). The fan units 250 and the heat source are located in the internal space 230 of the second component 200, respectively. Each of the fan units 250 is formed with an upper air inlet 251, a lower air inlet 252 and an air outlet (not shown). The upper air inlet 251 and the lower air inlet 252 are respectively located on two opposite sides of the fan unit 250, and the air outlet is located on one side of the fan unit 250 between the upper air inlet 251 and the lower air inlet 252. Each of the upper air inlets 251 is exactly oriented toward one of the through holes 221 of the second component 200 for introducing airflows into the fan unit 250 through the first ventilation opening S1 and the sunken portion 212. The lower air inlets 252 are oriented toward the breach 211 of the second component 200 for introducing airflows into the fan unit 250 through the second ventilation opening S2 and the breach 211. Each of the air outlets of the fan unit 250 is disposed in, or oriented toward the internal space 230 of the second component 200 so as to lead the introduced airflow to the heat source in the internal space 230.

As shown in FIG. 9A, in the present embodiment, the first cover member 500 is rotatably connected to the sunken portion 212 so that the first cover member 500 is rotatable into or out of the sunken portion 212. More specifically, the second component 200 further is formed with one or more (e.g., four) slots 213, and exemplarily, the slots 213 are arranged spaced apart on one of inner walls of the sunken portion 212 which is opposite to the pivoting device 300. The first cover member 500 is formed with one or more (e.g., four) ribs 520, and exemplarily, the ribs 520 are arranged spaced apart on one edge of the first cover member 500 facing away from the pivoting device 300, and are removably received in the slots 213, respectively. Accordingly, when the first component 100 is rotated relative to the second component 200 so as to be in the unfolded state, with the movement of the pivoting device 300, the linkage module 400 can rotate the first cover member 500 so as to push another edge of the first cover member 500 being opposite to the ribs 520 out of the sunken portion 212 using the ribs 520 collectively to be a pivot point of the rotation of the first cover member 500 relative to the second component 200 (e.g., sunken portion 212). However, the disclosure is not limited thereto, and the first cover member may also be redesigned to be pushed out of the sunken portion vertically.

As shown in FIG. 9B, in the present embodiment, the second cover member 600 is rotatably connected to the bottom surface 220 of the second component 200 so that the second cover member 600 is rotatable into or out of the bottom surface 220 of the second component 200. The second component 200 is provided with one or more (e.g., two) rotary shaft portions 222, and exemplarily, the rotary shaft portions 222 are located oppositely on an inner side of the above-mentioned breach 211 facing away from the pivoting device 300. The second cover member 600 is provided with one or more (e.g., two) pivot-receiving portions 620, and exemplarily, the pivot-receiving portions 620 are located on one surface of the second cover member 600 and arranged opposite to the second lugs 610. Each of the rotary shaft portions 222 is pivotally disposed within one of the pivot-receiving portions 620.

Accordingly, when the first component 100 is rotated relative to the second component 200 so as to be in the unfolded state, with the movement of the pivoting device 300, the linkage module 400 can rotate the second cover member 600 so as to push one edge of the second cover member 600 being opposite to the pivot-receiving portions 620 out of the above-mentioned breach 211 using the rotary shaft portions 222 collectively to be a pivot point of the rotation of the second cover member 600 relative to the second component 200 (e.g., the above-mentioned breach 211). However, the disclosure is not limited thereto, and the second cover member 600 may also be redesigned to be pushed out of the breach vertically.

With the structure described in the above embodiments, the portable electronic device can be switched to provide more ventilation openings, thereby improving the heat dissipation efficiency of the portable electronic device, reducing the possibility of causing crash and shortening the working life of each component of the portable electronic device. In addition, since the portable electronic device is already formed with at least one ventilation opening, the portable electronic device can choose to omit a fixing opening thereon, so that the overall thickness of the portable electronic device can be improved.

Although the disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:
1. A portable electronic device, comprising:
a first component;
a pivoting device that comprises
a shaft set,
a linkage guiding post fixedly sleeved on the shaft set, and
a spiral guide groove formed on a circumferential surface of the linkage guiding post, and extending from one end of the linkage guiding post to the other end of the linkage guiding post according to a spiral extension fashion;
a second component pivotally coupled to the first component through the pivoting device, and formed with an internal space and a sunken portion that is in communication with the internal space;
at least one first cover member movably disposed in the sunken portion; and
a linkage module coupled to the pivoting device and the at least one first cover member for selectively pushing the at least one first cover member out of the sunken portion with a movement of the pivoting device, the linkage module comprising
a sliding component slidably located within the spiral guide groove,
a first connecting lever rotatably connected to the sliding component,
a leading frame slidably connected to the at least one first cover member, and
a second connecting lever pivotally connected to the first connecting lever and the leading frame, wherein
with the guiding of the spiral guide groove, the sliding component is linearly movable relative to the linkage guiding post in a first direction to collectively rotate the first connecting lever and the second connecting lever, and linearly moves the leading frame in a second direction, wherein the second direction is orthogonal to the first direction.

2. The portable electronic device of claim 1, wherein the at least one first cover member is one of a keyboard set and an outer finishing panel.

3. The portable electronic device of claim 1, further comprising:
at least one second cover member that is disposed on the second component, wherein
the second component is formed with a breach that is formed on a bottom surface of the second component, the internal space is arranged between the sunken portion and the breach and in communication with the breach, and the at least one second cover member is movably disposed in the breach, and
the linkage module is coupled to the at least one second cover member for collectively pushing the at least one first cover member out of the sunken portion and the at least one second cover member out of the breach with the movement of the pivoting device.

4. The portable electronic device of claim 3, wherein the second component further comprises a plurality of foot cushions,
the foot cushions are respectively connected to the bottom surface of the second component, and
a partition space is defined by the foot cushions and the bottom surface of the second component, collectively, wherein the at least one second cover member being pushed out from the breach is located in the partition space.

5. The portable electronic device of claim 3, wherein the second component is provided with at least one rotary shaft portion,
the at least one second cover member is provided with at least one pivot-receiving portion, and
the at least one rotary shaft portion is pivotally disposed within the at least one pivot-receiving portion so as to be a pivot point of a rotation of the at least one second cover member relative to the second component, wherein,
when the at least one second cover member uses the at least one rotary shaft portion as the pivot point, the at least one second cover member is rotated out of the breach with the movement of the pivoting device.

6. The portable electronic device of claim 1, further comprising:
at least one fan unit located within the internal space for introducing airflows into the internal space through the sunken portion.

7. The portable electronic device of claim 1, wherein the second component is formed with at least one slot,
the at least one first cover member is provided with at least one rib, and
the at least one rib is removably disposed within the at least one slot so as to be a pivot point of a rotation of the at least one first cover member relative to the second component, wherein,
when the at least one first cover member uses the at least one rib as the pivot point, the at least one first cover member is rotated out of the sunken portion with the movement of the pivoting device.

8. A portable electronic device, comprising:
a first component;
a pivoting device;
a second component pivotally coupled to the first component through the pivoting device, and formed with an internal space;
a plurality of cover members rotatably connected to the second component respectively, and respectively embedded in two opposite surfaces of the second component; and
a linkage module coupled to the pivoting device and the cover members,
wherein, when the first component rotates relative to the second component, the linkage module respectively rotates the cover members out of the opposite surfaces of the second component with a movement of the pivoting device such that a ventilation opening in communication with the internal space is formed between the second component and each of the cover members.

* * * * *